United States Patent
Lin

(10) Patent No.: US 10,327,355 B2
(45) Date of Patent: Jun. 18, 2019

(54) WATER-COOLING HEAT DISSIPATION DEVICE AND WATER BLOCK THEREOF

(71) Applicant: COOLER MASTER CO., LTD., New Taipei (TW)

(72) Inventor: Jen-Cheng Lin, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 228 days.

(21) Appl. No.: 14/645,509

(22) Filed: Mar. 12, 2015

(65) Prior Publication Data

US 2016/0227672 A1 Aug. 4, 2016

(30) Foreign Application Priority Data

Jan. 29, 2015 (TW) .............. 104201446 U

(51) Int. Cl.
*H05K 7/20* (2006.01)
*H01L 23/427* (2006.01)
*H01L 23/473* (2006.01)
*H01L 23/367* (2006.01)

(52) U.S. Cl.
CPC ....... *H05K 7/20254* (2013.01); *H01L 23/427* (2013.01); *H01L 23/473* (2013.01); *H05K 7/20309* (2013.01); *H01L 23/3677* (2013.01)

(58) Field of Classification Search
CPC ............ H05K 7/20254; H05K 7/20309; H01L 23/427; H01L 23/3677; H01L 23/473
See application file for complete search history.

(56) References Cited

U.S. PATENT DOCUMENTS

| 5,087,888 A * | 2/1992 | Mountz ................ H01L 23/427 257/E23.088 |
| 6,410,982 B1 * | 6/2002 | Brownell ............ F28D 15/0266 257/713 |
| 7,254,026 B2 * | 8/2007 | Yang .................... H01L 23/427 165/182 |
| 2007/0204646 A1 * | 9/2007 | Gagliano ............ F28D 15/0233 62/389 |
| 2008/0310105 A1 * | 12/2008 | Cheng .................. H01L 23/427 361/695 |
| 2011/0008198 A1 * | 1/2011 | Hou ....................... B22F 1/0011 419/6 |

* cited by examiner

*Primary Examiner* — Jon T. Schermerhorn, Jr.
(74) *Attorney, Agent, or Firm* — Maschoff Brennan

(57) ABSTRACT

A water-cooling heat dissipation device includes a vapor chamber, a heat conduction cylinder, and a cover. A first chamber is formed in the vapor chamber. The heat conduction cylinder extends from a surface of the vapor chamber. A second chamber communicating with the first chamber is formed in the heat conduction cylinder. A working fluid flows in the first chamber and the second chamber. The cover covers the vapor chamber; the heat conduction cylinder is disposed in the cover. By means of the working fluid flowing in the first chamber and the second chamber which communicate with each other, heat can be delivered rapidly from the vapor chamber to the heat conduction cylinder.

16 Claims, 7 Drawing Sheets

WATER-COOLING HEAT DISSIPATION DEVICE AND WATER BLOCK THEREOF

BACKGROUND OF THE INVENTION

Field of the Invention

The present invention relates to a water-cooling heat dissipation device and in particular to a water-cooling heat dissipation device which has a 3D (three-dimension) water block and a water block thereof.

Description of Prior Art

The water-cooling heat dissipation device is commonly applied to a computer to cool the CPU (Central Processing Unit) or GPU (Graphics Processing Unit). A general water-cooling heat dissipation device comprises a water block and a circulation pipe connected to the water block. The water block is attached to the CPU or the GPU to absorb the generated heat. The cooling water, which is filled in the circulation pipe, is driven by a pump to circulate through the water block to take the generated heat away from the CPU or the GPU.

A general water block is a metal block (e.g., a copper block or an aluminum block) having a flat shape. One side of the water block is attached to the heat source to absorb the generated heat and the other side of the water block is covered by a cover to which the circulation pipe is connected such that the cooling water can flow through the cover and contact the metal block to take away the heat inside the metal block during circulation. In general, some heat exchange structures such as flow channels, cylinders, or fins are disposed on the metal block to increase the contact surface between the metal block and the cooling water to enhance efficiency of heat convention. However, the shape variation of the heat exchange structures causes a decrease in the efficiency of heat conduction in the heat exchange structures; the efficiency of the heat conduction in the heat exchange structures is relatively lower than that in other portions of the metal block. As a result, only to increase the efficiency of heat convection between the metal block and the cooling water is limited in the improvement of the total efficiency of heat exchange of the water-cooling heat dissipation device.

In view of this, the inventor pays special attention to research with the application of related theory and tries to overcome the above disadvantages. Finally, the inventor proposes the present invention which is a reasonable design and effectively overcomes the above disadvantages.

SUMMARY OF THE INVENTION

The present invention provides a water-cooling heat dissipation device having a 3D water block and a water block thereof.

The present invention provides a water block which comprises a vapor chamber, a heat conduction cylinder, and a cover. A first chamber is formed in the vapor chamber. A heat conduction cylinder extends from a surface of the vapor chamber. A second chamber is formed in the heat conduction cylinder. The second chamber communicates with the first chamber. A working fluid flows in the first chamber and the second chamber. The cover covers the vapor chamber. The heat conduction cylinder is disposed in the cover.

A plurality of fins are preferably disposed on the heat conduction cylinder. The heat conduction cylinder can connect the fins in series. The fins can be individually formed on the heat conduction cylinder and extend from a side surface of the heat conduction cylinder. The heat conduction cylinder is preferably plural in number; the heat conduction cylinders are disposed on the same surface of the vapor chamber. The heat conduction cylinders are preferably parallel and spaced to one another. Each of an inner wall of the first chamber and an inner wall of the second chamber is provided with a wick structure.

The present invention also provides a water-cooling heat dissipation device which comprises a vapor chamber, a heat conduction cylinder, a cover, and a pump connected to the cover. A first chamber is formed in the vapor chamber. The heat conduction cylinder extends from a surface of the vapor chamber. A second chamber is formed in the heat conduction cylinder. The second chamber communicates with the first chamber. A working fluid flows in the first chamber and the second chamber. The cover covers the vapor chamber. The heat conduction cylinder is disposed in the cover.

A plurality of fins are preferably disposed on the heat conduction cylinder. The heat conduction cylinder can connect the fins in series. The fins can be individually formed on the heat conduction cylinder and extend from a side surface of the heat conduction cylinder. The heat conduction cylinder is preferably plural in number; the heat conduction cylinders are disposed on the same surface of the vapor chamber. The heat conduction cylinders are preferably parallel and spaced to one another. Each of an inner wall of the first chamber and an inner wall of the second chamber is provided with a wick structure.

The water-cooling heat dissipation device further preferably comprises a circulation pipe. Two ends of the circulation pipe are connected to the cover. The pump communicates with and is connected to the circulation pipe in series. Moreover, the water-cooling heat dissipation device further preferably comprises a water tank communicating with and connected to the circulation pipe in series and a radiator communicating with and connected to the circulation pipe in series. The pump can be directly attached on the cover.

The water-cooling heat dissipation device and the 3D water block thereof of the present invention use the vapor chamber and the first chamber and the second chamber which communicate with each other in the heat conduction cylinder for the working fluid flowing inside the above-mentioned chambers such that the water block can deliver the generated heat rapidly from the vapor chamber to the heat conduction cylinder.

DETAILED DESCRIPTION OF THE INVENTION

Figure 1:
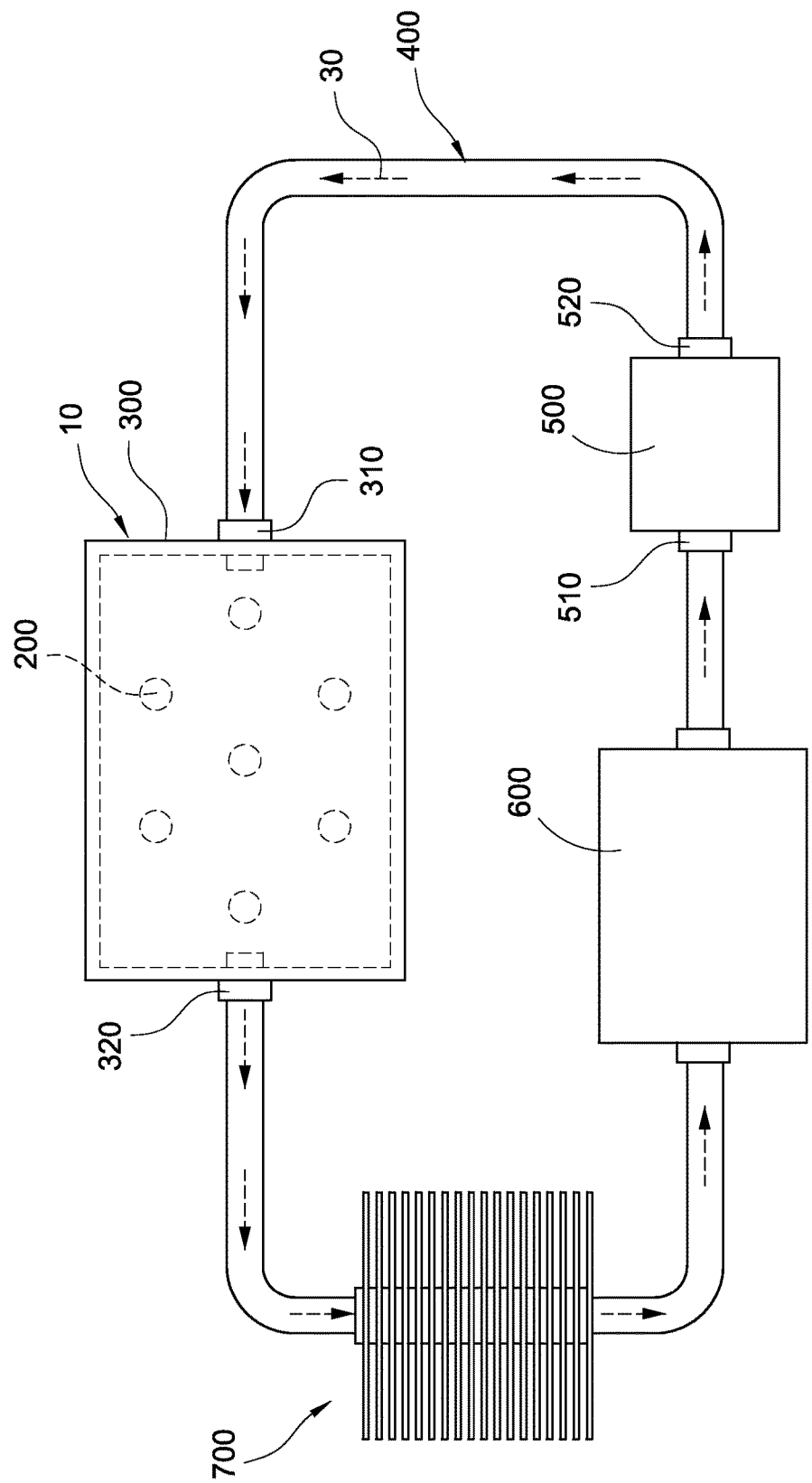
FIG. 1 is a schematic view of the water-cooling heat dissipation device according to the first embodiment of the present invention.
Figure 2:
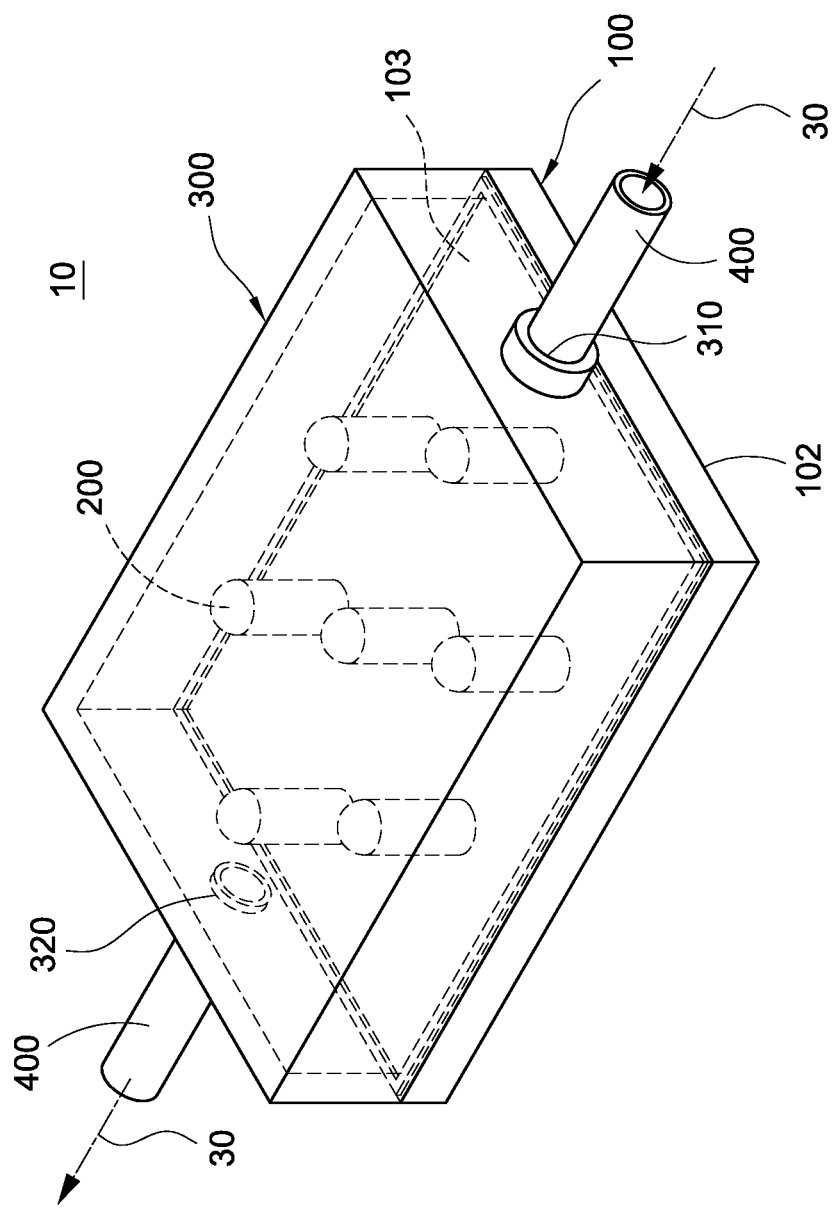
FIG. 2 is a perspective schematic view of the water block according to the first embodiment of the present invention.
Figure 3:
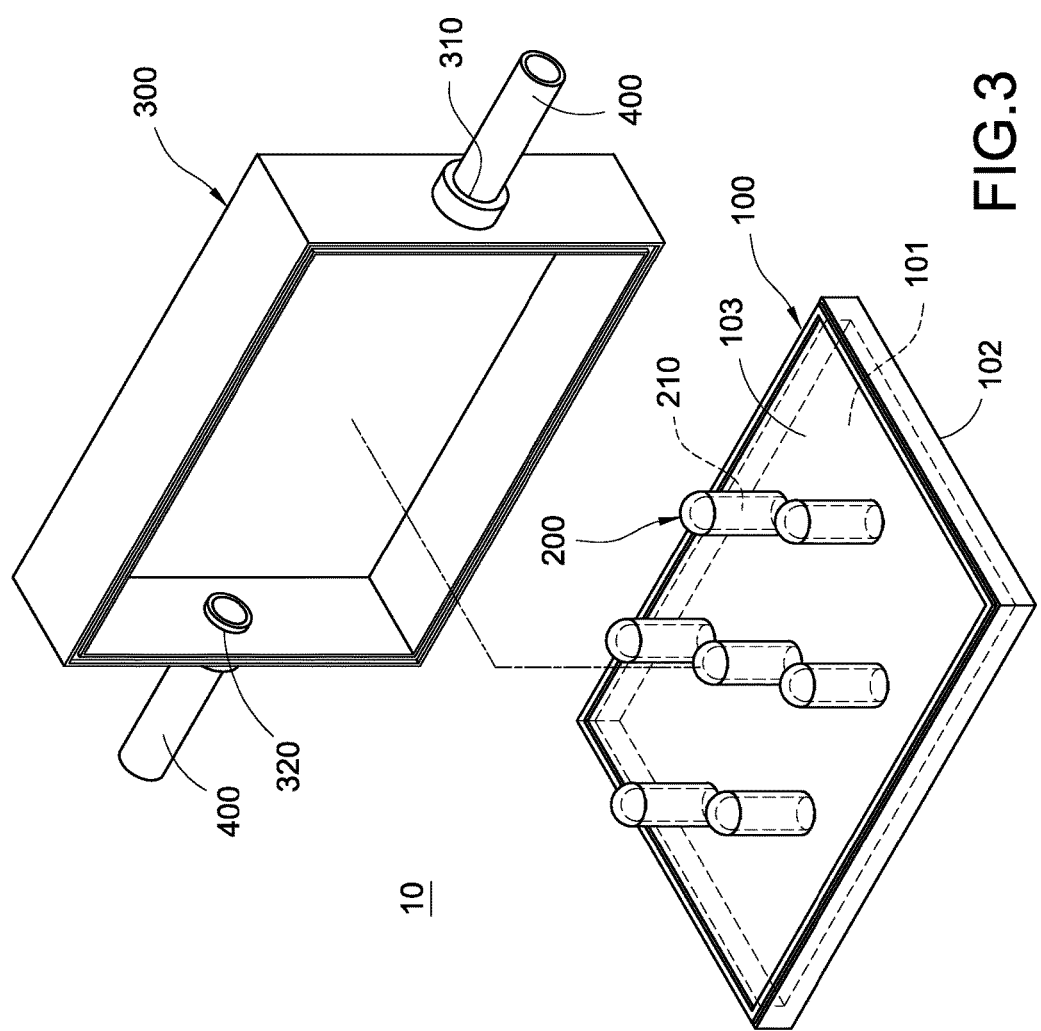
FIG. 3 is a perspective exploded view of the water block according to the first embodiment of the present invention.

Please refer to FIGS. 1-3. A water-cooling heat dissipation device is provided according to the first embodiment of the present invention. The water-cooling heat dissipation device comprises a water block 10, a circulation pipe 400, and a pump 500. The water block 10 comprises a vapor chamber 100, at least one heat conduction cylinder 200, and a cover 300.

Figure 4:
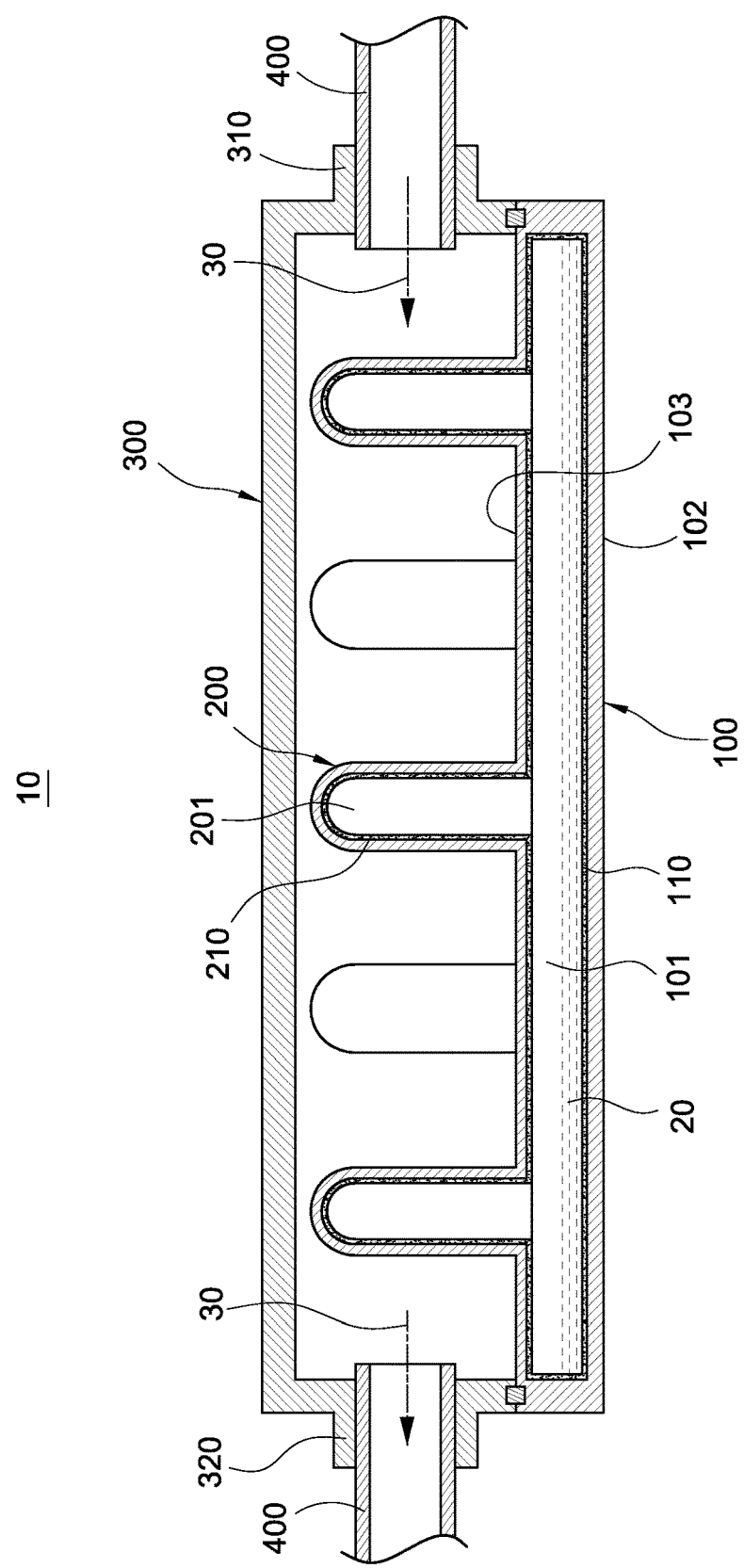
FIG. 4 is a cross-sectional schematic view of the water block according to the first embodiment of the present invention.

Please refer to FIGS. 2-4. In the current embodiment, the vapor chamber is preferably hollow and a first chamber 101 is formed in the vapor chamber. The vapor chamber 100 is preferably flat; two sides of the vapor chamber 100 individually form a heat conduction surface 102 and a heat convection surface 103 disposed opposite to the heat conduction surface 102.

In the current embodiment, the heat conduction cylinder 200 is preferably plural in number. Each of the heat conduction cylinders 200 extends from the heat convection surface 103 of the vapor chamber 100 such that the heat conduction cylinders 200 are individually disposed vertically to the heat convection surface 103 of the vapor chamber 100 in which the heat conduction cylinders 200 are parallel and spaced to one another. Each of the heat conduction cylinders 200 is hollow. A second chamber 201 is formed in each of the heat conduction cylinders 200. The second chambers 201 individually communicate with the first chamber 101 through the heat convection surface 103.

A liquid working fluid 20 is filled in the water block 10 and can flow in the first chamber 101 and the second chambers 201. In the current embodiment, a coolant is preferably selected as the working fluid 20, but not limited to this. Each of an inner wall of the first chamber 101 and inner walls of the second chambers (201) is provided with a wick structure 110/210.

The cover 300 covers the heat convection surface 103 of the vapor chamber 100 and thus covers the heat conduction cylinders 200. The cover 300 forms an inlet 310 and an outlet 320. The inlet 310 and the outlet 320 are preferably disposed at two sides of the cover 300, opposite to each other.

Please refer to FIGS. 1 and 4. Two ends of the circulation pipe 400 are individually connected to the inlet 310 and the outlet 320. The circulation pipe 400 is filled with a circulation fluid 30. In the current embodiment, water is preferably selected as the circulation fluid 30, but not limited to this.

Referring to FIG. 1, the pump 500 communicates with and is connected to the circulation pipe 400 in series to drive the circulation fluid 30 to flow in the circulation pipe 400. The pump 500 comprises a suction hole 510 and a discharge hole 520. Both of the suction hole 510 and the discharge hole 520 are connected to and communicate with the circulation pipe 400. The suction hole 510 is used to suck the circulation fluid 30 in the circulation pipe 400 and the discharge hole 520 is used to discharge the circulation fluid 30.

The water-cooling heat dissipation device of the present invention further preferably comprises a water tank 600 and a radiator 700. The water tank 600 and the radiator 700 are individually connected to the circulation pipe 400 in series. The water tank 600 is used to store the circulation fluid 30 to regulate and maintain the circulation fluid 30 to have a steady flow speed, mass flow and temperature in the circulation pipe 400. The radiator 700 is used for heat exchange between the circulation fluid 30 flowing therein and the ambient air. Thus, the heat stored in the circulation fluid 30 can be dissipated to the ambient air.

Referring FIGS. 1 and 4, the water-cooling heat dissipation device of the present invention is used to be disposed around a heat source (not shown) to cool the heat source. The heat source is a CPU or a GPU of a computer, but not limited to some specific types of heat sources. When the water-cooling heat dissipation device of the present invention is in use, the heat conduction surface 102 of the vapor chamber 100 is attached to the heat source such that the heat generated by the heat source can be delivered to the heat conduction surface 102 and further is absorbed by the liquid working fluid in the first chamber 101. Thus, the working fluid 20 is vaporized and flows into the second chambers 201 of the heat conduction cylinders 200. The circulation fluid 30 flows into the cover 300 through the inlet 310 of the cover 300 and flows over the heat conduction cylinders 200 where heat exchange occurs. In this way, the heat stored in the gaseous working fluid 20 in the second chambers 201 is transferred to the circulation fluid 30 and condense the working fluid 20. The liquid working fluid 20 in the second chambers 201 is delivered back into the first chamber 101 by absorption of the wick structure 110/210.

The heated circulation fluid 30 is discharged out of the cover 300 through the outlet 320 of the cover 300. The circulation fluid 30 dissipates the heat therein to the ambient air when flowing through the radiator 700 and is cooled down to have the temperature of entering the inlet 310. Then, the circulation fluid 30 is pumped into the inlet 310 by the pump 500 for the next heat exchange. By means of the circulation of the circulation fluid 30, the heat generated by the heat source can be removed to control the temperature of the heat source.

Figure 5:
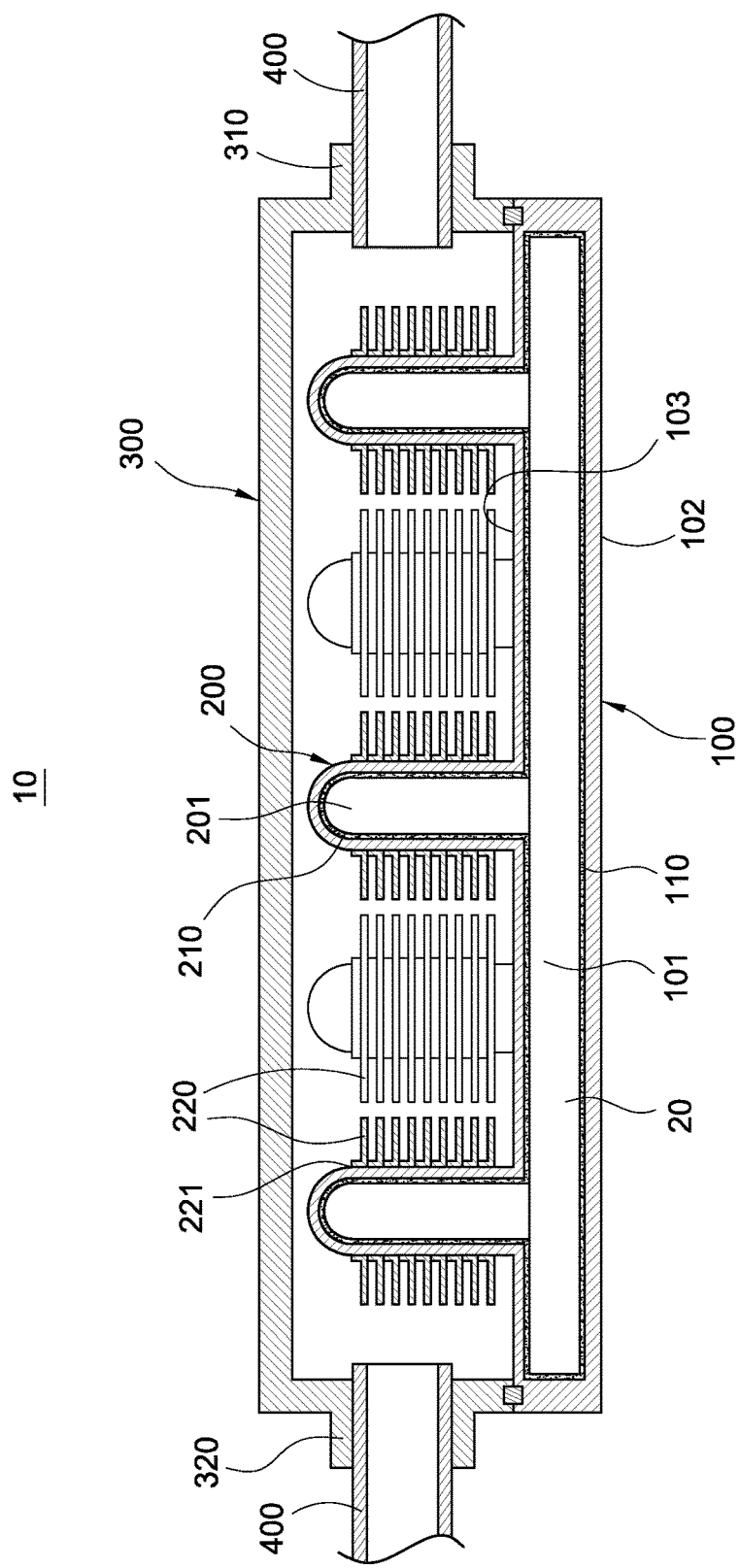
FIG. 5 is a schematic view of another water block according to the first embodiment of the present invention.

Referring to FIG. 5, a plurality of fins 220 can be disposed on the heat conduction cylinders 200 such that the contact surface between the heat conduction cylinders 200 and the circulation fluid 30 is increased to enhance efficiency of heat transfer. In the current embodiment, each of the fins 220 is provided with at least one throughhole 221. Each of the heat conduction cylinders 200 passes through the throughholes 221 of the fins 200 to connect the fins 220 in series. The heat conduction cylinder 200 and the fins 220 can be connected firmly through the throughholes 221 by tight pressing or welding. Each of the fins 220 can also be passed through plural heat conduction cylinders 200, but not limited to this.

Figure 6:
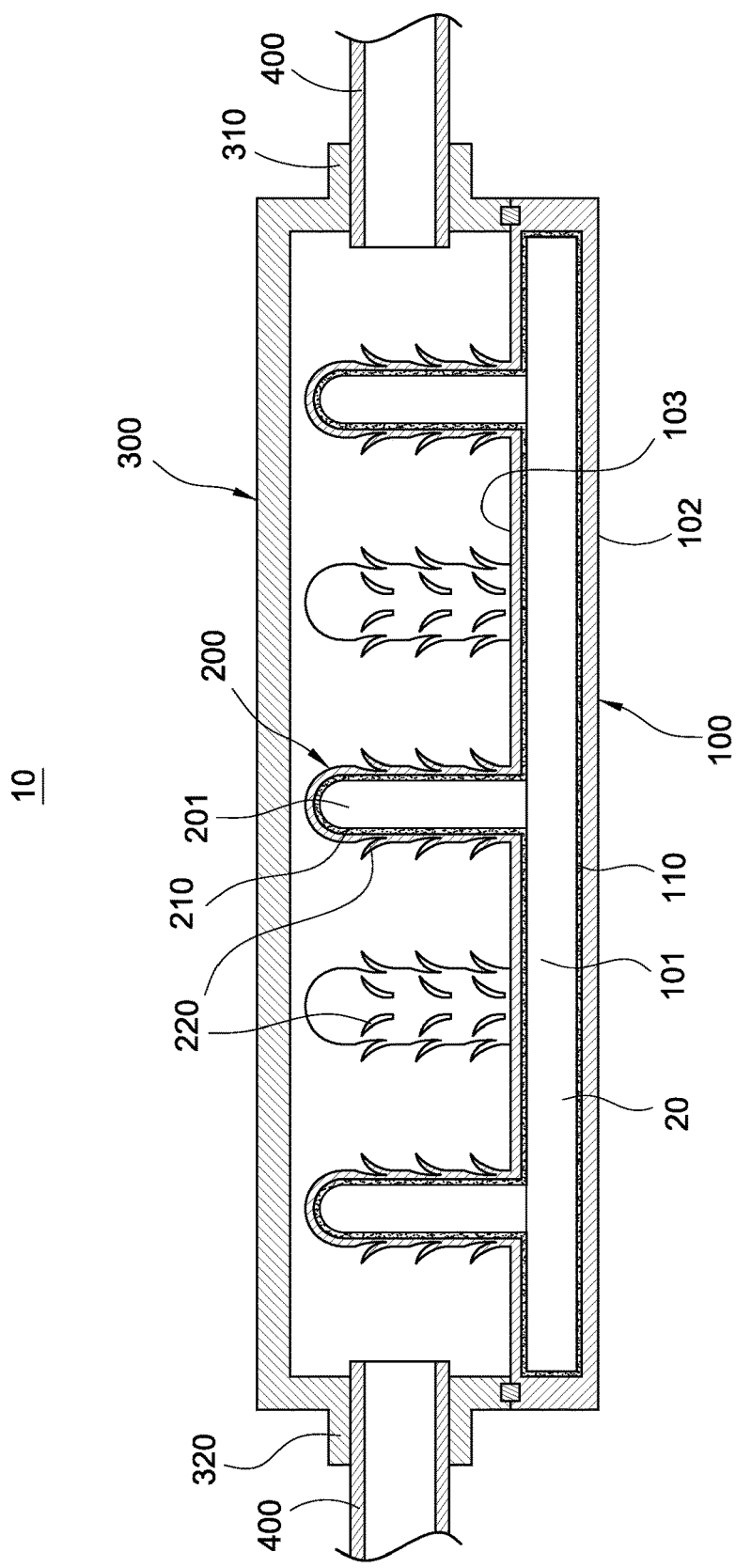
FIG. 6 is a schematic view of yet another water block according to the first embodiment of the present invention.

Referring to FIG. 6, the fins 220 can also be formed individually on the heat conduction cylinders 200 and each of the fins 220 extends from the side surface of the heat conduction cylinder 200. Preferably, the fins 220 are the sheets shoveled from the side surface of individual heat conduction cylinders 200 in which the sheets are bent to extend transverse to the heat conduction cylinder 200. Also, the fins 220 are formed integrated with the heat conduction cylinder 200 and thus the heat resistance between the fins 220 and the heat conduction cylinder 200 can be reduced.

Figure 7:
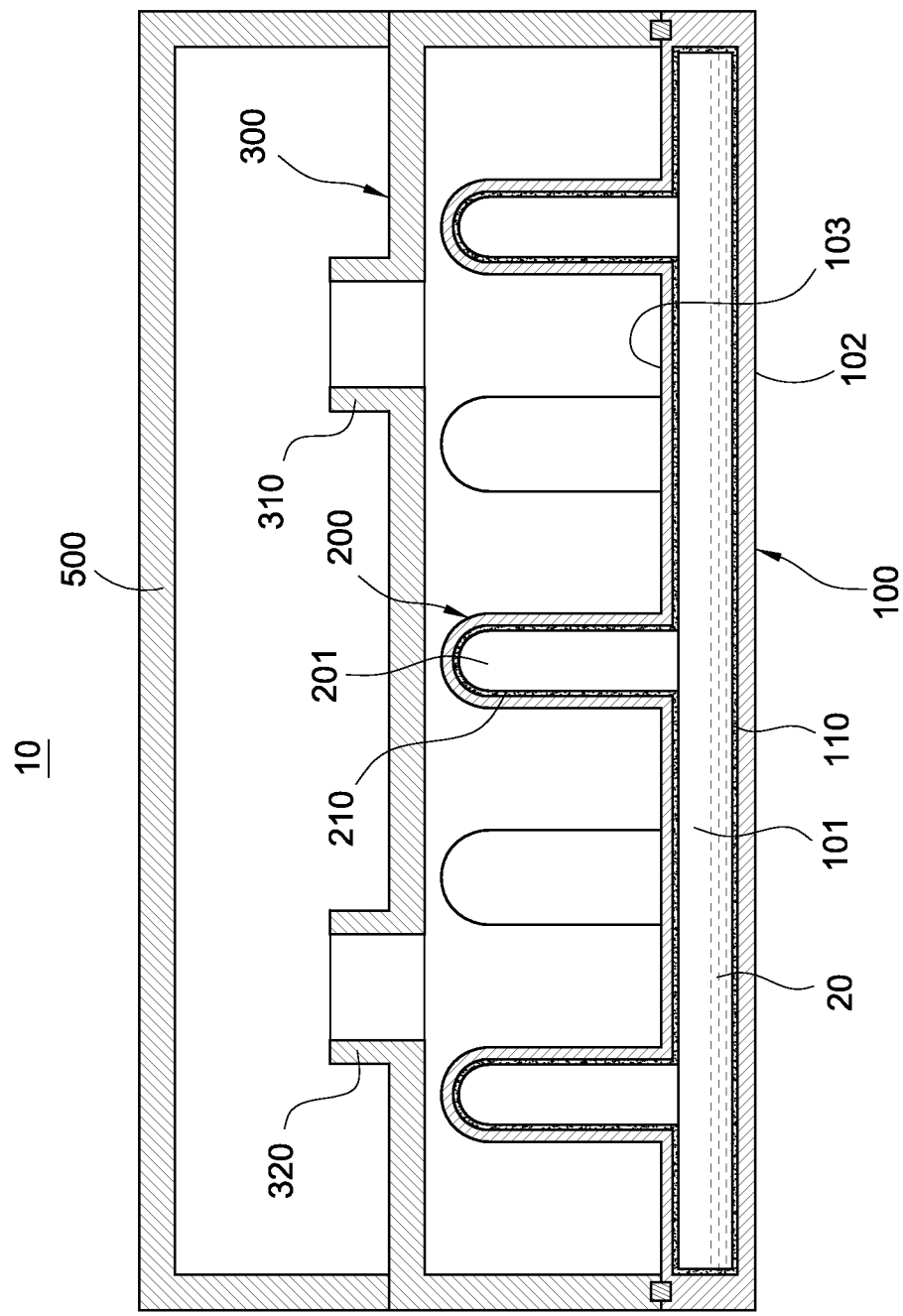
FIG. 7 is a schematic view of the water-cooling heat dissipation device according to the second embodiment of the present invention.

Referring to FIG. 7, a water-cooling heat dissipation device is provided according to the second embodiment of the present invention. The water-cooling heat dissipation device comprises a water block 10. The water block 10 comprises a vapor chamber 100, at least one heat conduction cylinder 200, and a cover 300. The water block 10 in the second embodiment is the same as that in the first embodiment and will not be described here again. In the current embodiment, the water-cooling heat dissipation device further comprises a pump 500. The pump 500 is attached on the cover 300 and is connected to and communicates with the inlet 310 and the outlet 320 of the cover 300. The circulation fluid 30 can be driven by the pump 500 to flow through the cover 300 and flow over the heat conduction cylinders 200.

The water-cooling heat dissipation device and the 3D water block thereof of the present invention use the vapor chamber 100 and the first chamber 201 and the second chamber 202 which communicate with each other in the heat conduction cylinder 200 for the working fluid 20 flowing inside the above-mentioned chambers. In this way, the water block 10 can deliver the generated heat rapidly from the vapor chamber 100 to the heat conduction cylinder 200 and the generated heat can be removed by the circulation fluid 30.

The embodiments described above are only preferred ones and not to limit the scope of appending claims regarding the present invention. Therefore, all the modifications of equivalent technology and means which apply the specification and figures of the present invention are embraced by the scope of the present invention.

What is claimed is:

1. A water block, comprising:
    a vapor chamber, wherein a first chamber is formed in the vapor chamber;
    a plurality of heat conduction cylinders extending from a surface of the vapor chamber, wherein a second chamber is formed in the plurality of heat conduction cylinders, wherein the second chamber communicates with the first chamber, wherein a working fluid flows in the first chamber and the second chamber;
    a plurality of fins disposed on the plurality of heat conduction cylinders, wherein on each of the plurality of heat conduction cylinders, the plurality of fins are bent to extend transverse to the plurality of heat conduction cylinders and are formed integrated with plurality of the heat conduction cylinders; and
    a cover covering the vapor chamber, wherein the plurality of heat conduction cylinders are disposed in the cover,
    wherein a subset of the plurality of heat conduction cylinders are located on a straight line between an inlet and an outlet of the vapor chamber, and another subset of the plurality of heat conduction cylinders are arranged in rows arranged in a direction orthogonal to the straight line between the inlet and the outlet and not aligned with the subset of the plurality of heat conduction cylinders located on the straight line between the inlet and the outlet.

2. The water block according to claim 1, wherein the heat conduction cylinder connects the fins in series.

3. The water block according to claim 1, wherein the fins are individually formed on the plurality of heat conduction cylinders and extend from a side surface of the plurality of heat conduction cylinders.

4. The water block according to claim 1, wherein each of the plurality of fins is only attached to one of the heat conduction cylinders.

5. The water block according to claim 1, wherein the plurality of heat conduction cylinders are parallel and spaced to one another.

6. The water block according to claim 1, wherein each of an inner wall of the first chamber and an inner wall of the second chamber is provided with a wick structure.

7. A water-cooling heat dissipation device, comprising:
    a vapor chamber, wherein a first chamber is formed in the vapor chamber;
    a plurality of heat conduction cylinders extending from a surface of the vapor chamber, wherein a second chamber is formed in the plurality of heat conduction cylinders, wherein the second chamber communicates with the first chamber, wherein a working fluid flows in the first chamber and the second chamber;
    a plurality of fins disposed on the plurality of heat conduction cylinders, wherein on each of the plurality of heat conduction cylinders, the plurality of fins are formed integrated with the plurality of heat conduction cylinders; and
    a cover covering the vapor chamber wherein the plurality of heat conduction cylinders are disposed in the cover and
    a pump connected to the cover,
    wherein a subset of the plurality of heat conduction cylinders are located on a straight line between an inlet and an outlet of the vapor chamber, and another subset of the plurality of heat conduction cylinders are arranged in rows arranged in a direction orthogonal to the straight line between the inlet and the outlet and not aligned with the subset of the plurality of heat conduction cylinders located on the straight line between the inlet and the outlet.

8. The water-cooling heat dissipation device according to claim 7, wherein the plurality of heat conduction cylinders connect the fins in series.

9. The water-cooling heat dissipation device according to claim 7, wherein the fins are individually formed on the plurality of heat conduction cylinders and extend from a side surface of the plurality of heat conduction cylinders.

10. The water-cooling heat dissipation device according to claim 7, where in each of the plurality of fins is only attached to one of the heat conduction cylinders.

11. The water-cooling heat dissipation device according to claim 7, wherein the plurality of heat conduction cylinders are parallel and spaced to one another.

12. The water-cooling heat dissipation device according to claim 7, wherein each of an inner wall of the first chamber and an inner wall of the second chamber is provided with a wick structure.

13. The water-cooling heat dissipation device according to claim 7, further comprising a circulation pipe, wherein two ends of the circulation pipe are connected to the cover, wherein the pump communicates with and is connected to the circulation pipe in series.

14. The water-cooling heat dissipation device according to claim 13, further comprising a water tank communicating with and connected to the circulation pipe in series.

15. The water-cooling heat dissipation device according to claim 13, further comprising a radiator communicating with and connected to the circulation pipe in series.

16. The water-cooling heat dissipation device according to claim 7, wherein the pump is attached on the cover.

* * * * *